United States Patent
Kurimoto et al.

(10) Patent No.: US 7,696,708 B2
(45) Date of Patent: Apr. 13, 2010

(54) RIPPLE DETECTING DEVICE

(75) Inventors: Muneaki Kurimoto, Obu (JP); Hitoshi Ishikawa, Hekinan (JP); Eiichiro Shigehara, Chofu (JP)

(73) Assignee: Aisin Seiki Kabushiki Kaisha, Kariya-shi (JP)

( * ) Notice: Subject to any disclaimer, the term of this patent is extended or adjusted under 35 U.S.C. 154(b) by 330 days.

(21) Appl. No.: 11/751,842

(22) Filed: May 22, 2007

(65) Prior Publication Data

US 2007/0273363 A1    Nov. 29, 2007

(30) Foreign Application Priority Data

May 23, 2006  (JP) ............................... 2006-142870

(51) Int. Cl.
*H02P 6/10* (2006.01)

(52) U.S. Cl. ............................ 318/400.23; 318/400.01; 318/400.24; 318/400.25; 320/165

(58) Field of Classification Search .............. 318/400.23, 318/603, 400.01, 400.06, 400.24, 400.25, 318/128; 320/165; 363/46
See application file for complete search history.

(56) References Cited

U.S. PATENT DOCUMENTS

| | | | | |
|---|---|---|---|---|
| 4,491,770 A | * | 1/1985 | Gotou .................... | 318/400.07 |
| 4,645,991 A | * | 2/1987 | Ban et al. .................... | 388/822 |
| 5,173,645 A | * | 12/1992 | Naito ..................... | 318/400.04 |
| 5,510,689 A | * | 4/1996 | Lipo et al. .................. | 318/809 |
| 5,539,290 A | * | 7/1996 | Lu et al. ..................... | 318/565 |
| 5,777,449 A | * | 7/1998 | Schlager ..................... | 318/459 |
| 6,144,179 A | * | 11/2000 | Kessler et al. ................ | 318/565 |
| 6,326,757 B1 | * | 12/2001 | Aoki et al. .................. | 318/599 |
| 6,456,028 B2 | * | 9/2002 | Aoki et al. .................. | 318/470 |
| 6,693,407 B2 | * | 2/2004 | Atmur ........................ | 318/811 |
| 6,768,282 B2 | * | 7/2004 | Lutter et al. ................ | 318/603 |
| 6,828,753 B2 | * | 12/2004 | Grasso et al. ............... | 318/801 |
| 6,847,914 B2 | * | 1/2005 | Gerlach ...................... | 702/151 |
| 6,861,966 B2 | * | 3/2005 | Otte ........................... | 341/116 |
| 7,026,779 B2 | * | 4/2006 | Eba ............................. | 318/609 |
| 7,030,589 B2 | * | 4/2006 | Kaneko et al. ......... | 318/400.02 |

(Continued)

FOREIGN PATENT DOCUMENTS

JP    2000-166274    6/2000

(Continued)

*Primary Examiner*—Bentsu Ro
*Assistant Examiner*—Antony M Paul
(74) *Attorney, Agent, or Firm*—Oblon, Spivak, McClelland, Maier & Neustadt, L.L.P.

(57) ABSTRACT

A ripple detecting device for detecting a ripple from an armature current outputted from a motor by overlapping a low band noise having a frequency of one/n (wherein "n" is a natural number more than 1) includes an initial ripple detecting device for detecting a cycle of the ripple in advance, a feature detecting device for detecting a feature of the ripple from the armature current outputted from the motor. The ripple detecting device further includes a ripple detecting control device for detecting the ripple by comparing the feature of the ripple with the low band noise having the frequency of one/n detected by the feature detecting device at a time before the present time with the feature of the ripple detected by the feature detecting device at the present time and judging that a ripple is generated when the features of the time before the present time and the present time present are resembled.

11 Claims, 13 Drawing Sheets

U.S. PATENT DOCUMENTS

| | | | |
|---|---|---|---|
| 7,064,509 B1 * | 6/2006 | Fu et al. | 318/400.23 |
| 7,265,538 B2 * | 9/2007 | Micke et al. | 318/400.13 |
| 7,352,145 B2 * | 4/2008 | Moller et al. | 318/254.1 |
| 2004/0118194 A1 * | 6/2004 | Raichle | 73/118.1 |
| 2005/0190094 A1 * | 9/2005 | Andersen | 341/157 |

FOREIGN PATENT DOCUMENTS

| | | |
|---|---|---|
| JP | 2003-9585 | 1/2003 |
| JP | 2003-536355 | 12/2003 |

* cited by examiner

FIG. 3A  Ripple

FIG. 3B  Low band noise having frequency of 1/2 of ripple

FIG. 3C  Low band noise having frequency of 1/3 of ripple

FIG. 3D  Synthesized waveform of A+B

FIG. 3E  Synthesized waveform of A+B+C

F I G. 13
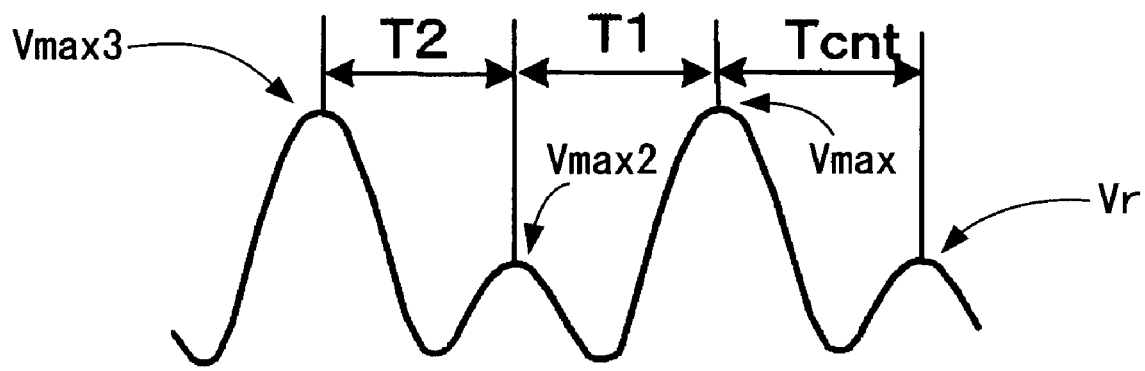

RIPPLE DETECTING DEVICE

This application is based on and claims priority under 35 U.S.C. §119 to Japanese Patent Application 2006-142870, filed on May 23, 2006, the entire content of which is incorporated herein by reference.

Field of the Invention

The present invention generally relates to a ripple-detecting device, and more particularly to a ripple-detecting device for detecting a rotational state of a drive shaft of a motor to detect a position of an element driven by the motor.

Background

A ripple-detecting device for detecting a ripple in the current outputted from the armature of DC motor (Direct Current motor) so that the rotational state of the drive shaft of the DC motor can be detected. Such detecting device is known, for example, in the following documents:

(Patent Document 1): JP 2003-536355A (corresponding to U.S. Pat. No. 6,768,282B2)
(Patent Document 2): JP 2000-166274

The ripple-detecting device disclosed in the Patent Document 1 includes a detecting method in which the armature analogue current signal is sampled as a sampling frequency, which is higher than a ripple frequency, and then the sampled frequency is binarized to form a pulse. Thus formed pulse is considered as a ripple and the cycle of the ripple is corrected by comparing the cycle with another cycle of the ripple to prevent erroneous detection (counting) of the number of ripples.

Another ripple detecting device disclosed in the Patent Document 2 includes an amplification of the ripple current by a gain which is inversely proportional to the current value of the armature to prevent erroneous detection of the ripples based on the smaller ripple wave height due to the low band noise frequency lower than the ripple frequency.

Thus, a need exists for a ripple detecting device to surely detect ripple condition with a downsized detecting circuit.

SUMMARY OF THE INVENTION

According to an aspect of the present invention, a ripple detecting device for detecting a ripple from an armature current outputted from a motor by overlapping a low band noise having a frequency of one/n (wherein "n" is a natural number more than 1) includes an initial ripple detecting device for detecting a cycle of the ripple in advance, a feature detecting device for detecting a feature of the ripple from the armature current outputted from the motor and a ripple detecting control device for detecting the ripple by comparing the feature of the ripple with the low band noise having the frequency of one/n detected by the feature detecting device at a time before the present time with the feature of the ripple detected by the feature detecting device at the present time and judging that a ripple is generated when the features of the time before the present time and the present time present are resembled.

BRIEF DESCRIPTION OF THE DRAWINGS

The foregoing and additional features and characteristics of the present invention will become more apparent from the following detailed description considered with reference to the accompanying drawings, wherein:

FIG. 3A illustrates a ripple waveform of the armature current;
FIG. 3B illustrates a low-band noise having a frequency of one half of the ripple waveform in FIG. 3A;
FIG. 3C illustrates a low band noise having a frequency of one third of the ripple waveform in FIG. 3A;
FIG. 3D illustrates a synthesized waveform (A+B) of ripple in FIG. 3A and the low band noise of the one third of the ripple in FIG. 3C;
FIG. 3E illustrates a synthesized waveform (A+B+C) of the ripple in FIG. 3A, frequency in FIG. 3B and the frequency of FIG. 3D;
FIG. 13 illustrates a waveform of the armature current according to the fourth embodiment of the invention.

DETAILED DESCRIPTION OF THE EMBODIMENTS

Figure 1:
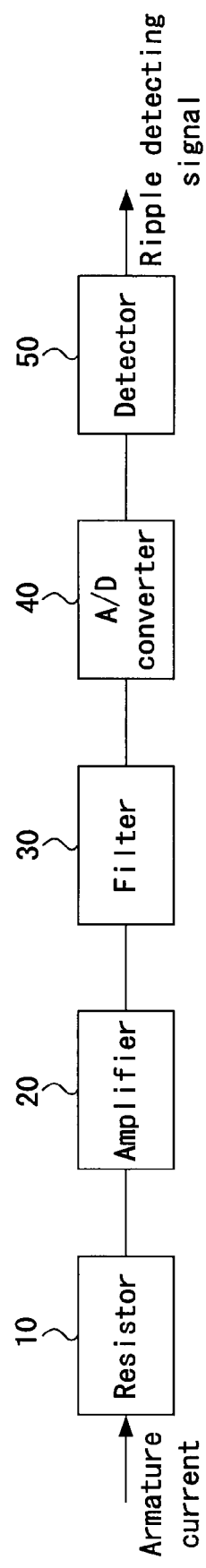
FIG. 1 is a schematically illustrated ripple detecting device according to the present invention.
Figure 2:
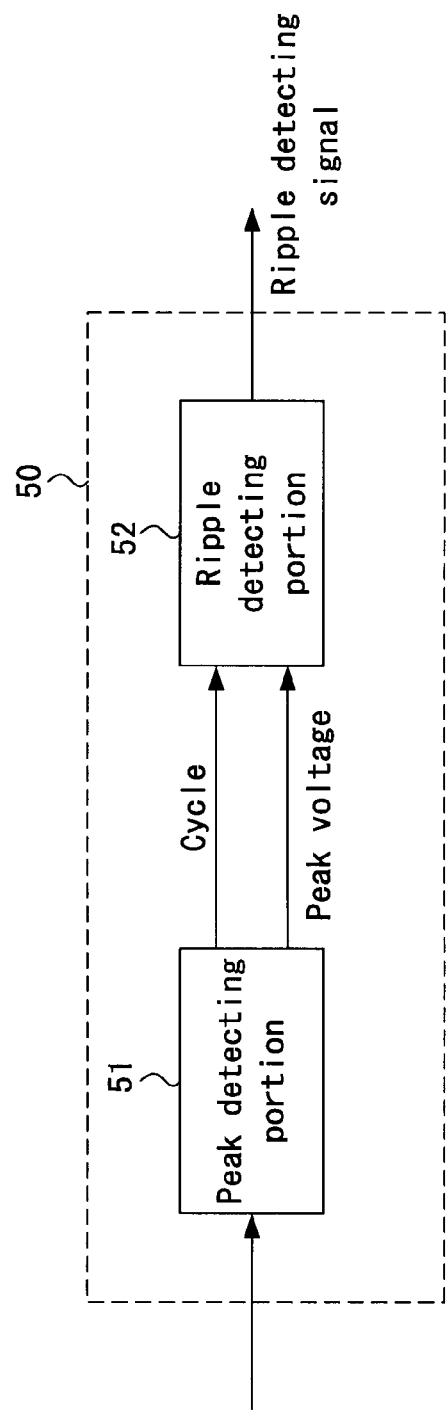
FIG. 2 illustrates a detecting device shown in FIG. 1.

Some preferred embodiments related to the present invention will be explained below with reference to the attached drawings. FIG. 1 shows a schematic view of the ripple-detecting device according to the first embodiment of the invention. FIG. 2 shows a detector (detecting device) 50 in FIG. 1. The ripple-detecting device is the device for detecting a ripple in a current outputted from an armature of a DC motor and outputting a ripple-detecting signal. A resistor 10, an amplifier 20, a filter 30, an A/D converter 40 and a detector 50 are connected in series, as shown in FIG. 1, and form the ripple detecting device.

The resistor 10 is formed by a shunt resistor not shown) and converts the current of the armature of the DC motor into a voltage. The amplifier 20 includes a calculation amplifier (not shown) to amplify the voltage generated by the resistor 10. The filter 30 filters the output signal of the amplifier 20 to remove a high frequency component of the frequency higher than a ripple frequency. The filter 30 includes a variable frequency interruption adaptive filter (not shown). The A/D converter 40 is a circuit for converting the output signal from the filter 30 into a digital signal.

The detector 50 includes a peak detecting portion 51 and a ripple-detecting portion 52 as shown in FIG. 2, and is formed by a CPU and various memories (not shown). The detector 50 detects a ripple included in the armature current based on the digital signal given from the A/D converter 40 in sequence and outputs a pulse synchronized with the ripple as a ripple-detecting signal.

In the ripple-detecting device according to this first embodiment, a ripple, which is included in the armature current, is detected. The low band noise can be ignored when the motor is operated under no load condition, but cannot be ignored when the motor is operated under a load added condition. Such low band noise can be usually negligible when the motor is operated under no loaded condition. When such low band noise is overlapped on the armature current, the ripple detection may be deteriorated and the accuracy of detection function may be reduced.

A main low noise band frequency is 1/N of the ripple frequency (wherein, N is a natural number more than 1). In FIG. 3A to FIG. 3E, various types of waves are illustrated. Frequency in FIG. 3A indicates a ripple waveform and FIG. 3B indicates a frequency of a low band noise having one half (½) of the frequency of the ripple in FIG. 3A. Frequency in FIG. 3C indicates another low band noise having one third (⅓) of the frequency of the ripple in FIG. 3A.

The frequency in FIG. 3D indicates a synthesized frequency of the ripple frequency in FIG. 3A and the one half low band noise frequency in FIG. 3B. The cycle (or period) of the maximum point and the minimum point appearing in this waveform is the same with the cycle of the ripple frequency waveform, but the maximum point and the minimum point are variable (the height of the peak or the minimum point are different) and a pattern having the same maximum and minimum points with the ripple waveform in FIG. 3A appears and is repeated every two cycles of the ripple frequency.

When the frequencies of FIGS. 3A, 3B and 3C are synthesized, a frequency in FIG. 3E is generated. The cycle of the maximum and minimum points appearing is the same with those of the ripple frequency in FIG. 3A, but the pattern with the same maximum and minimum points appears and is repeated every 6 (2 by 3) cycles of the ripple frequency in FIG. 3A.

Figure 4:
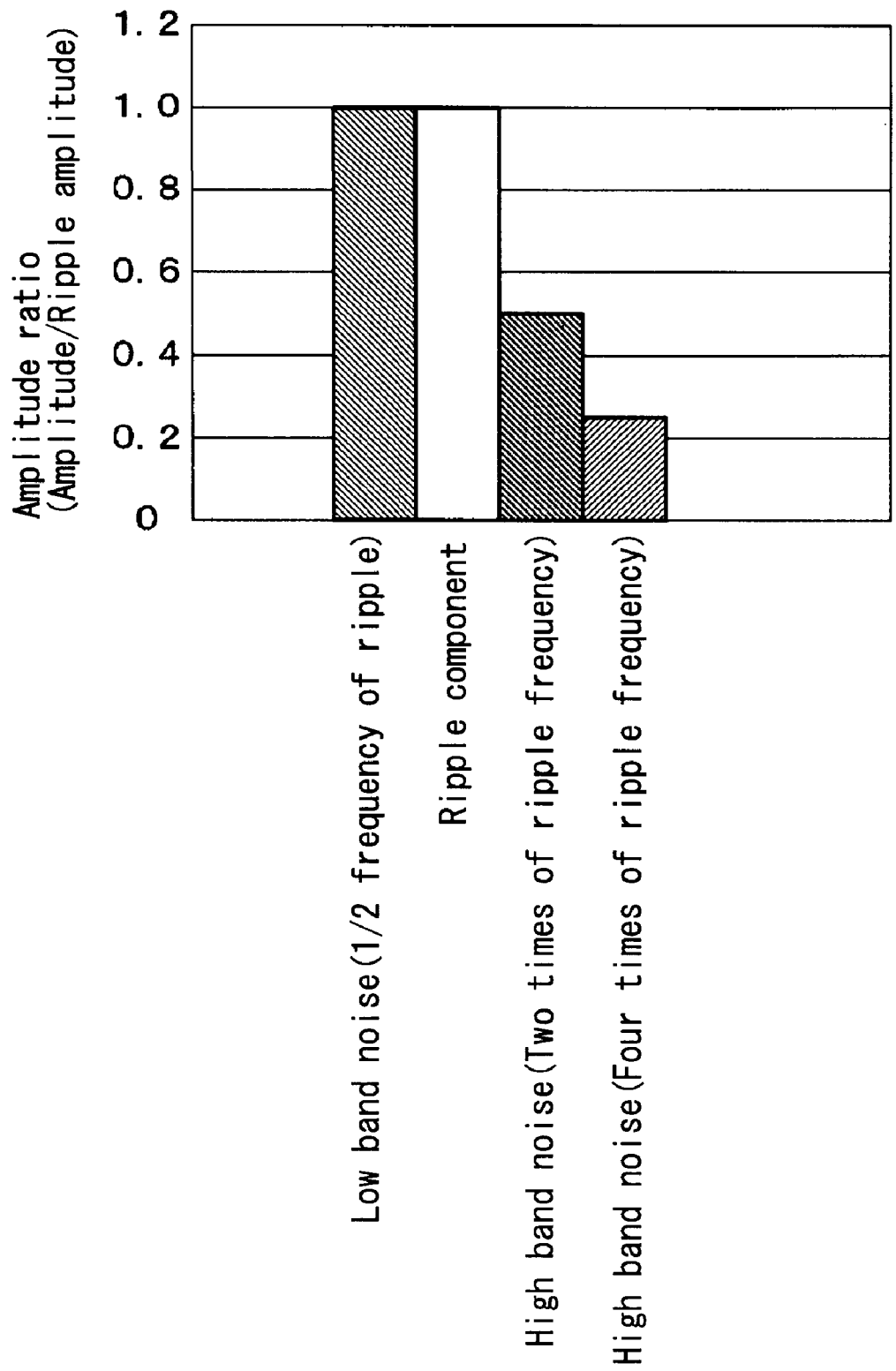
FIG. 4 illustrates an example of frequency spectrum of an armature current according to the present invention.

When the ripple is detected from the synthesized frequency such as the frequency in FIG. 3D or in FIG. 3E, the detection may fail due to the distortion of these waveforms. According to the embodiment of the invention, the detection is achieved as the following method which can avoid erroneous detection:

FIG. 4 shows a frequency spectrum, which indicates frequency components of the armature current, wherein the vertical axis represents amplitude ratio of each frequency amplitude component relative to the ripple amplitude. The high band frequency components of two times, four times of the ripple frequency and the low band frequency component of the one half (½) of the ripple frequency can be mainly seen in the drawing. In this case, the other components can be negligible.

The filter 30 interrupts or filters each high band frequency component and accordingly, such high frequency components do not influence on the detection of the ripple detection is made. The low band frequency component indicates one half of the ripple frequency. If the low band noise exists in only the one half of the ripple frequency, a new ripple can be detected by comparing the feature of the frequency with the feature of the one before the two ripples and is registered in the detector 50.

The ripple-detecting device includes the detector 50 in which a ripple is registered, which is compared with the new ripple. Ripples are detected sequentially according to the flows shown in FIGS. 5 and 6.

Figure 5:
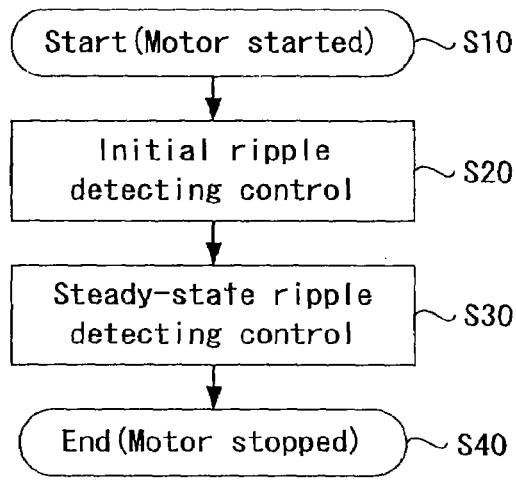
FIG. 5 illustrates a control flowchart of detecting ripples.
Figure 6:
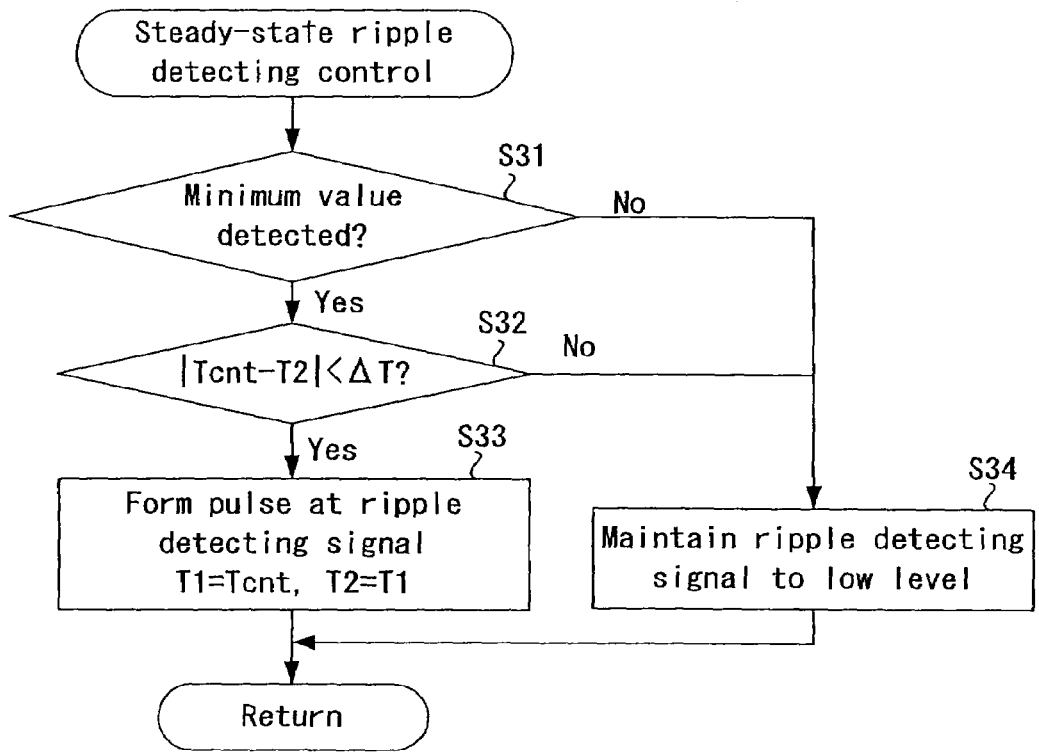
FIG. 6 is a flowchart explaining in detail an example of control for detecting steady-state ripples according to the control in FIG. 5.

FIG. 6 indicates a flowchart showing the steady-state ripple control in FIG. 5.

When the DC motor is activated (S10 in FIG. 5), the motor is operated with no load and no low band noise is overlapped on the armature current outputted from the motor. Accordingly, only the components of ripples to be detected are detected. Ripples are judged from the armature current under the no load operation at the initial ripple detecting control stage (step S20), which is immediately after the start of the motor.

The armature current flows through the resistor 10 where the voltage corresponding to the current value is generated. The amplifier 20 amplifies the voltage generated at the resistor 10. The filter 30 removes the high frequency components from the output signal of the amplifier 20. The A/D converter 40 converts the amplified signal amplified by the amplifier 20 into the digital signal. The peak detecting portion 51 of the detector 50 detects a peak digital signal, for example, the minimum value, given in sequence from the converter 40 and at the same time detects the cycle of the minimum value. The ripple-detecting portion 52 considers the cycle of the minimum value to be the cycle of the ripple and sets the ripple-detecting signal to a high level for a certain period of time.

After the initial ripple detecting control stage (S20), the DC motor is operated under a load added condition and the steady-state ripple detecting control (S30) is conducted. This controlling continues until the DC motor is stopped (S40).

Figure 7:
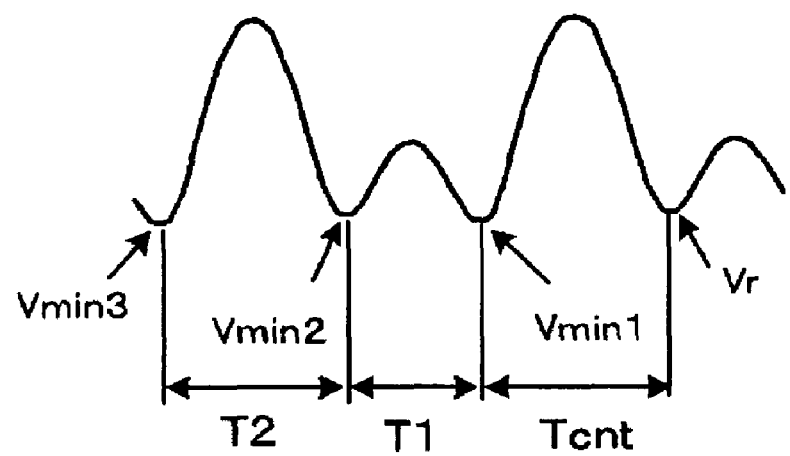
FIG. 7 illustrates a view explaining waveform of the armature current.

The steady-state ripple detecting control (S30) includes the steps S31 to S34 in FIG. 6. FIG. 7 shows a waveform of the armature current. The peak detecting portion 51 of the detector 50 starts counting at the time when the minimum value Vmin1 of the armature current is detected from the digital signal (at the step S31: YES) and counts the cycle Tcnt until the next minimum value Vr is detected as shown in FIG. 7.

The ripple detecting portion 52 judges whether the difference between the cycle (period) Tcnt counted at the peak detecting portion 51 and the ripple cycle T2 detected two ripples before is smaller than a predetermined value ΔT or not (at the step S32). It is preferable to set the value ΔT relatively to the value of cycle T2. When the difference between the value Tcnt and the value T2 is smaller than the predetermined value ΔT (at the step S32: YES), a ripple is considered to be detected and a pulse is formed by setting the ripple signal level to be high for a certain period of time (step S33). Further, after the ripple signal level has been set to be high, the cycle Tcnt is set to be the ripple cycle T1 that corresponds to the cycle of the ripple one before. The previous cycle T1 then is set to the cycle T2 that corresponds to the cycle two ripples before.

In other words, the detector 50 compares the cycle Tcnt with the cycle T2 and if the values of two cycles resemble, a ripple is judged to be generated in the armature current.

If no minimum value Vr is detected (step S31: NO), or if the difference between the cycles Tcnt and T2 is not smaller than the predetermined value ΔT (at the step S32: NO), the ripple-detecting signal is kept at low level (step S34).

Figure 8:
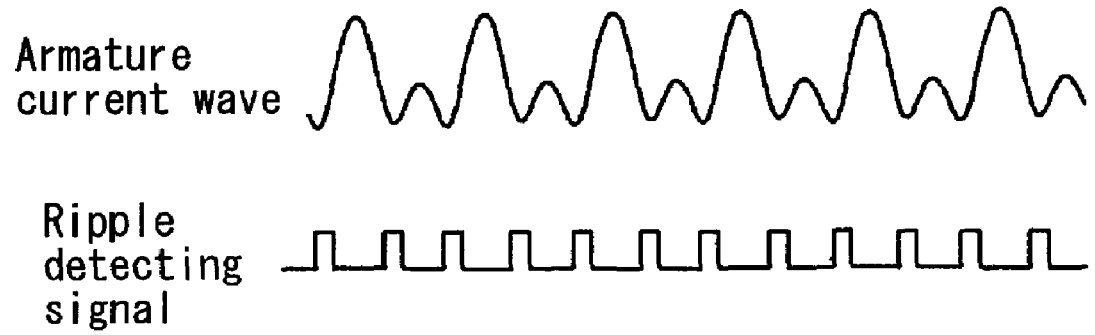
FIG. 8 illustrates a waveform of the armature current and the corresponding ripple detecting signal.

FIG. 8 shows the detail of ripple detecting signal. By repeating the steps between S31 and S34 in FIG. 6, a synthesized pulse is formed in the ripple-detecting signal by overlapping the ripples on the armature current.

As explained, according to the ripple detecting device of the embodiment, first assuming that a ripple is generated between the minimum values, then the time between the minimum values is detected as a ripple feature of the present time point, and then the ripple feature is compared with a ripple feature detected at a previous time point to judge whether a ripple is generated or not in the armature current. This can eliminate any variable gain amplifier or gain setting circuit as needed in the device disclosed in the Patent Document 2. Thus the ripple-detecting device according to this embodiment of the invention can be manufactured with a smaller size circuit compared with the size in the conventional circuit. Also an erroneous detection can be avoided because the ripple feature of previous time point, which is compared with the ripple feature of the present time point, is the ripple feature of the time point at the time two ripples before (see FIG. 7) and this means that the comparison is made at the portion where the waveform of the armature current resembles.

Figure 9:
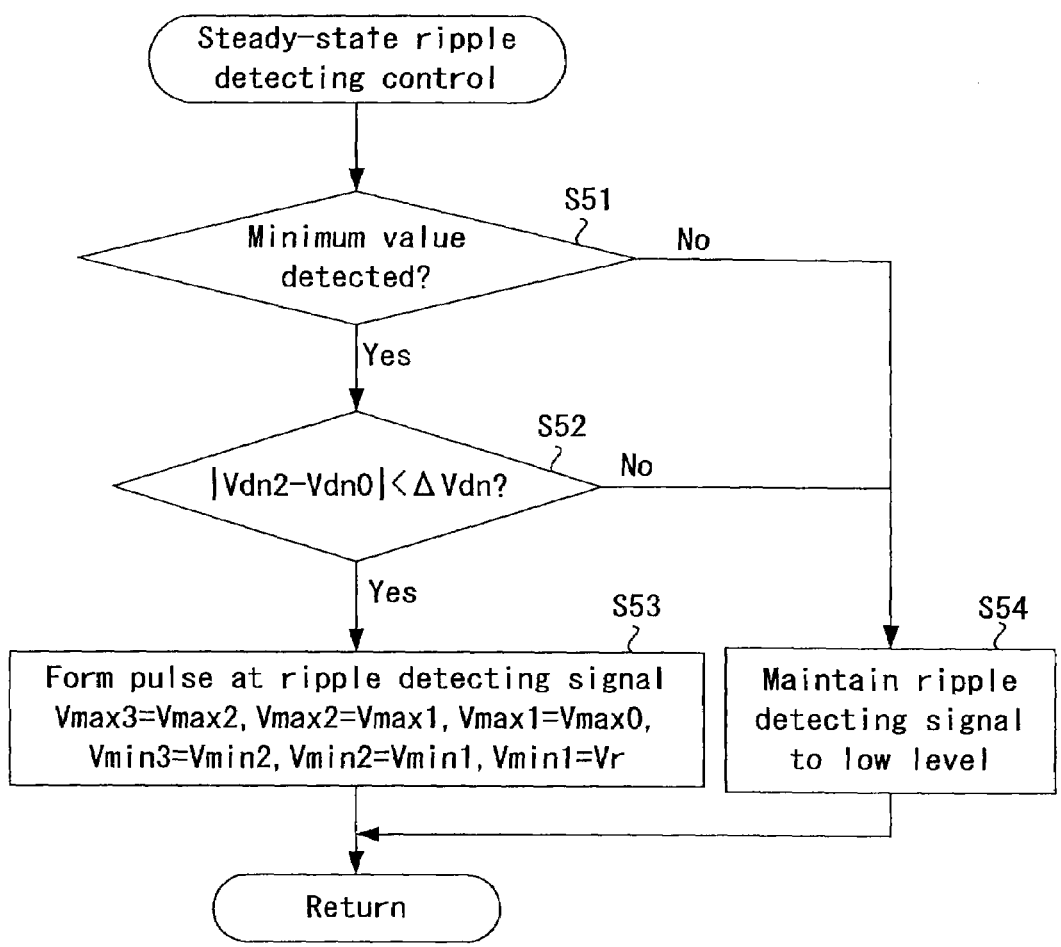
FIG. 9 is a flowchart indicating steady-state ripple detecting control according to a second embodiment of the invention.
Figure 10:
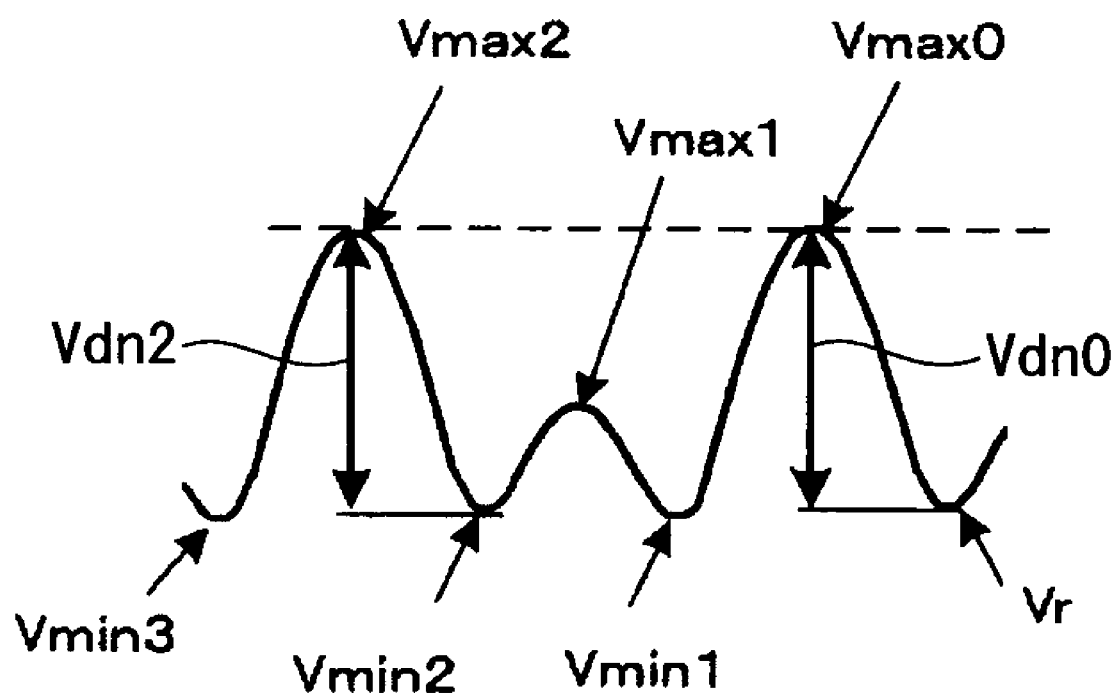
FIG. 10 illustrates a waveform of the armature current according to the second embodiment.

FIG. 9 shows the second embodiment of the invention wherein the flowchart shows a steady-state ripple detecting control step. FIG. 10 shows the waveform of the armature current according to the second embodiment.

The ripple generation is verified based on the ripple feature at the time period between the neighboring minimum values in the armature current according to the previous (first) embodiment. However, the ripple feature is not necessarily be verified by such time period between the two neighboring minimum values.

According to this second embodiment, the ripple feature is assumed to be amplitude from the maximum value of the armature current to the minimum value. The structure of the ripple-detecting device is the same as that of the first embodiment. The armature current is overlapped with a low band noise of the one half (½) frequency of the ripple to be detected.

The initial ripple detecting control is achieved as the same method as the one in the first embodiment. After the initial ripple detecting control, a steady-state ripple detecting control is conducted by starting the DC motor under the load added state. The steady-state ripple detecting control in this embodiment includes the steps S51 to S54 in FIG. 9. With reference to FIGS. 9 and 10, when the peak detecting portion 51 (FIG. 2) detects the minimum value Vr (FIG. 10) in the armature current from the digital signal inputted from the A/D converter 40 (step S51: YES), the ripple detecting portion 52 (FIG. 2) obtains the amplitude Vdn0 from the maximum value Vmax0 detected before the minimum value Vr (Vdn0=Vmax0−Vr). This can be explained clearly in FIG. 10. Then, the ripple-detecting portion 52 obtains the amplitude Vdn2, which is the difference between the minimum value Vmin2, detected at the time two ripples before and the maximum value Vmax2 which is detected at the time before the minimum value Vmin2 (Vdn2=Vmax2−Vmin2). Then the ripple-detecting portion 52 judges whether or not the difference between the values of Vdn2 and Vdn0 is smaller than the predetermined value ΔVdn (at the step S52 in FIG. 9 and waveform in FIG. 10). It is preferable to set the value ΔVdn relative to the value Vdn2.

When the amplitude difference between Vdn2 and Vdn0 is smaller than the value ΔVdn (step S52: YES), it is assumed that a ripple is generated and then the pulse is formed by changing the level of ripple detecting signal to high for a certain period of time (step S53). When the ripple detecting signal level is maintained to be at high for a time period, the present minimum value Vr and past minimum values Vmin1 and Vmin2 (see waveform in FIG. 10) are respectively shifted to the minimum values of Vmin1, Vmin2 and Vmin3 for preparing for the coming of the next ripple. Similarly, the maximum values of Vmax0, Vmax1 and Vmax2 are respectively shifted to Vmax1, Vmax2 and Vmax3.

When the minimum value Vr is not detected (step S51: NO), or the amplitude difference between Vdn2 and Vdn0 is not smaller than the predetermined value ΔVdn (step S52: NO), the ripple signal level is kept to be Low (step S54).

By repeating the steps S51 to S54, a pulse is formed in the ripple detecting signal by synchronizing with the ripple overlapped on the armature current.

According to this second embodiment, since a rising down amplitude is assumed to be a ripple feature to be detected, a ripple can be surely detected even when the ripple or low band noise frequency is fluctuated.

Figure 11:
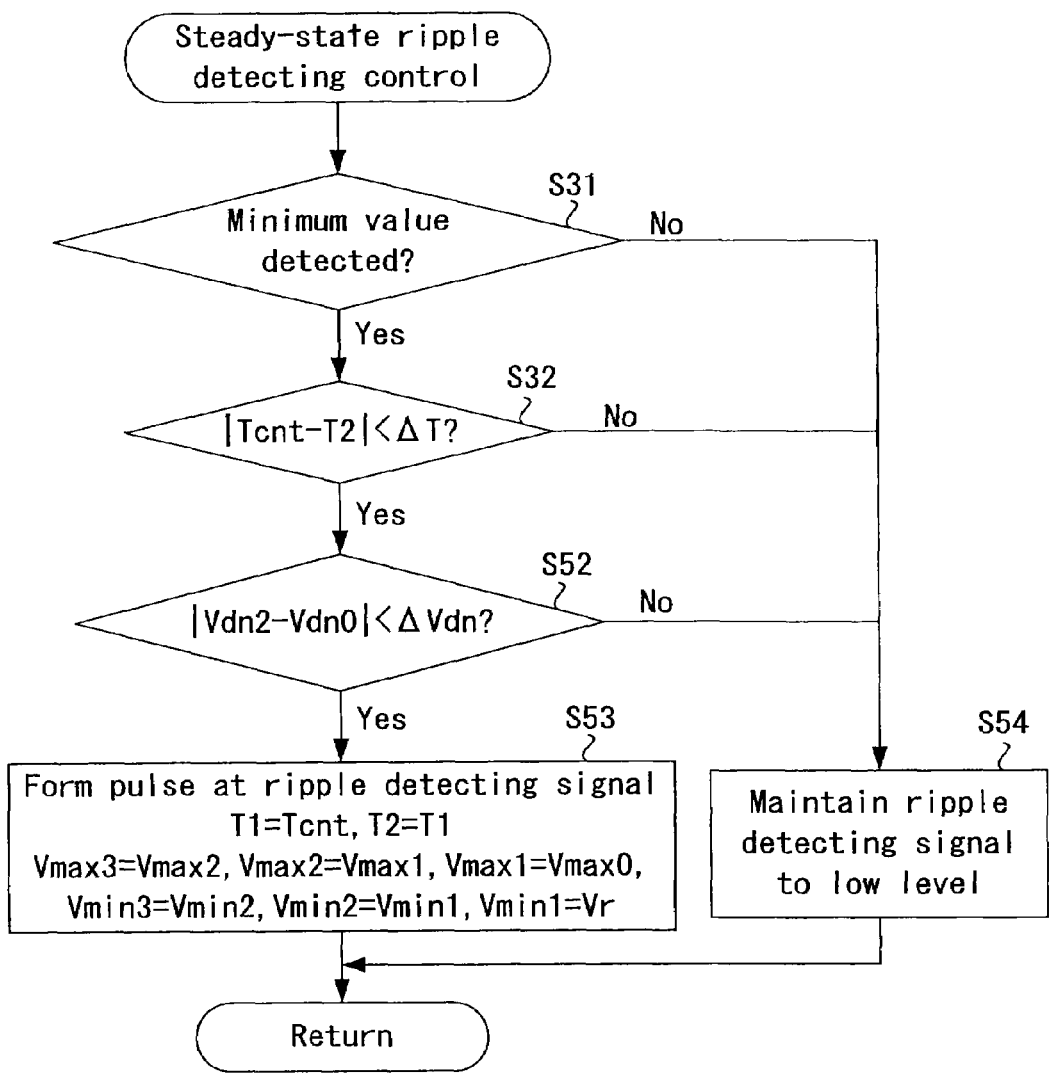
FIG. 11 is a flowchart similar to FIG. 9, but showing a third embodiment of the invention.

Now explaining the third embodiment of the invention, wherein FIG. 11 shows a flowchart of a steady-state ripple detecting control of this embodiment. The same numerals are referenced with the same elements illustrated in FIG. 6 or FIG. 9.

The ripple feature of the first embodiment is the time difference between the neighboring minimum values, whereas in this second embodiment, rising up amplitude is the ripple feature to be detected. In this third embodiment, these two features (one is the time difference and the other is the rising up amplitude) are used. The structure of the ripple detecting device (shown in FIG. 1 and FIG. 2) is the same with the previous embodiments and the armature current is overlapped on a low band noise of one half frequency of the ripple to be detected.

The initial ripple detecting control is achieved as the same method as the one in the first embodiment. After the initial ripple detecting control, a steady-state ripple detecting control is made by operating the DC motor under the load added state. The peak detecting portion 51 of the detector 50 starts counting at the time when the minimum value Vmin1 of the armature current is detected from the digital signal (at the step S31: YES) and counts the cycle Tcnt until the next minimum value Vr is detected.

The ripple detecting portion 52 judges whether the difference between the cycle Tcnt counted at the peak detecting portion 51 and the ripple cycle T2 detected at the time two ripples before is smaller than a predetermined value ΔT or not (at the step S32). It is preferable to set the value ΔT relatively to the value of cycle T2.

When the difference between the value Tcnt and the value T2 is judged to be smaller than the predetermined value ΔT (at the step S32: YES), the ripple detecting portion 52 obtains the amplitude Vdn0 rising down from the maximum value Vmax0 detected before the minimum value Vr (Vdn0=Vmax0−Vr). Then, the ripple detecting portion 52 obtains the amplitude Vdn2 which is the difference between the minimum value Vmin2 detected at the time two ripples before and the maximum value Vmax2 which has been detected before the minimum value Vmin2 (Vdn2=Vmax2−Vmin2). Then the ripple detecting portion 52 judges whether or not the difference between the values of Vdn2 and Vdn0 is smaller than the predetermined value ΔVdn (at the step S52). It is preferable to set the value ΔVdn relative to the value Vdn2.

When the amplitude difference between Vdn2 and Vdn0 is smaller than the value ΔVdn (step S52: YES), it is assumed that a ripple is generated and the pulse is formed by changing the level of ripple detecting signal to high for a period of time (step S53). When the ripple detecting signal level is kept to be high for a time period, the present minimum value Vr and past minimum values Vmin1 and Vmin2 are respectively shifted to the minimum values of Vmin1, Vmin2 and Vmin3 for preparing the coming of the next ripple. Similarly, the maximum values of Vmax0, Vmax1 and Vmax2 are respectively shifted to Vmax1, Vmax2 and Vmax3. Also the cycle length of Tcnt is shifted to the cycle T1 that is the cycle of one ripple before and the cycle T1 is shifted T2 which corresponds to the cycle two ripples before.

If no minimum value Vr is detected (step S31: NO), or if the difference between the cycles Tcnt and T2 is not smaller than the predetermined value ΔT (at the step S32: NO), or the amplitude difference between Vdn2 and Vdn0 is not smaller than the predetermined value ΔVdn (step S52: NO), the ripple signal level is kept to be Low (step S54).

According to this embodiment, since the ripple feature includes both the time difference between the neighboring minimum values and the rising down amplitude, prevention of the erroneous detection can be further improved.

All the previous embodiments explain the detection of ripple at the time of minimum value of the armature current and based on the minimum value point, the ripple is detected. The following fourth embodiment explains about the ripple detection based on the maximum value point of the armature current.

Figure 12:
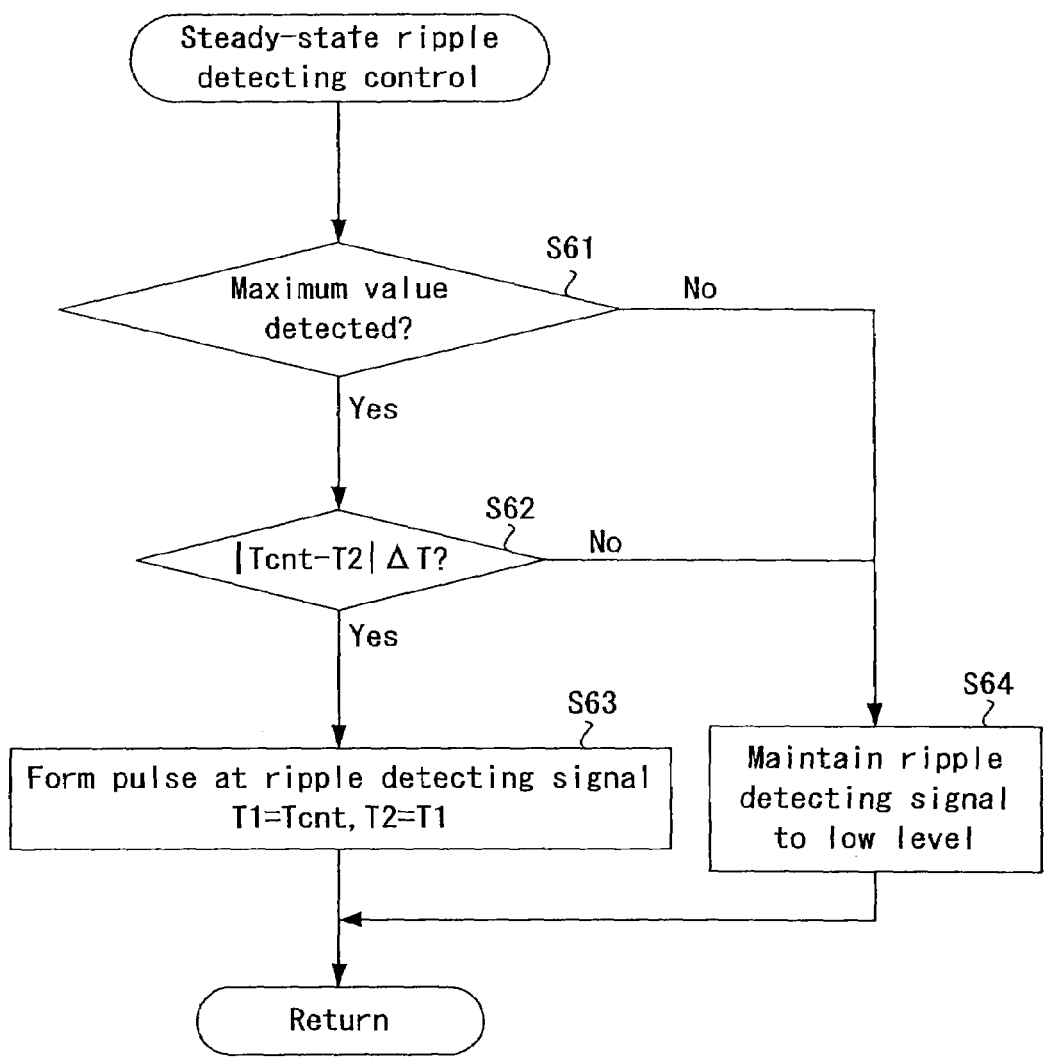
FIG. 12 is a flowchart similar to FIG. 9, but showing a fourth embodiment of the invention.

FIG. 12 shows the flowchart of the steady-state ripple detecting control according to the fourth embodiment of the invention.

According to this fourth embodiment, the ripple feature includes the time between the neighboring two maximum values and based on this feature the ripple generation is verified. The structure of the ripple detecting device is the same as that of the first embodiment. The armature current is overlapped with a low band noise of one half frequency of the ripple to be detected.

The initial ripple detecting control is achieved as the same method as the one in the first embodiment. After the initial ripple detecting control, a steady-state ripple detecting control is achieved by operating the DC motor under the load being added state. The steady-state ripple detecting control in this embodiment includes the steps S61 to S64 in FIG. 12.

The peak detecting portion 51 of the detector 50 starts counting at the time when the maximum value Vmax1 of the armature current is detected from the digital signal (at the step S61: YES) and starts counting of the length of the cycle Tcnt until the next maximum value Vr is detected.

The ripple detecting portion 52 judges whether the difference between the cycle Tcnt counted at the peak detecting portion 51 and the ripple cycle T2 detected at the time two ripples before is smaller than a predetermined value ΔT or not (at the step S62). It is preferable to set the value ΔT relatively to the value of cycle T2. When the difference between the value Tcnt and the value T2 is smaller than the predetermined value ΔT (at the step S62: YES), a ripple is considered to be detected and a pulse is formed by setting the ripple signal level to be high for a certain period of time (step S63). Further, after the ripple signal level has been set to be high, the cycle Tcnt is set to be the ripple cycle T1 that corresponds to the cycle one ripple before. The previous cycle T1 then is shifted to the cycle T2 that corresponds to the cycle two ripples before.

In other words, the detector 50 compares the value of cycle Tcnt with the value of cycle T2 and if the values of two cycles resemble, it is judged that a ripple is generated in the armature current.

If no maximum value Vr is detected (step S61: NO), or if the difference between the cycles Tcnt and T2 is not smaller than the predetermined value ΔT (at the step S62: NO), the ripple-detecting signal is kept to be at low level (step S64).

By repeating the steps S61 to S64, a pulse is formed by synchronizing with the ripple overlapped on the armature current.

As explained, according to the ripple detecting device of this embodiment, first assuming that a ripple is generated between the maximum values, then the time between the maximum values is detected as a ripple feature of the present time point, and then the ripple feature is compared with a ripple feature detected at a previous time point to judge whether a ripple is generated or not in the armature current. This can eliminate any variable gain amplifier or gain setting circuit as needed in the device disclosed in the Patent Document 2. Thus the ripple detecting device according to this embodiment of the invention can be manufactured with a smaller size circuit compared with the size in the conventional circuit as are the same advantages appearing in the first embodiment.

Figure 14:
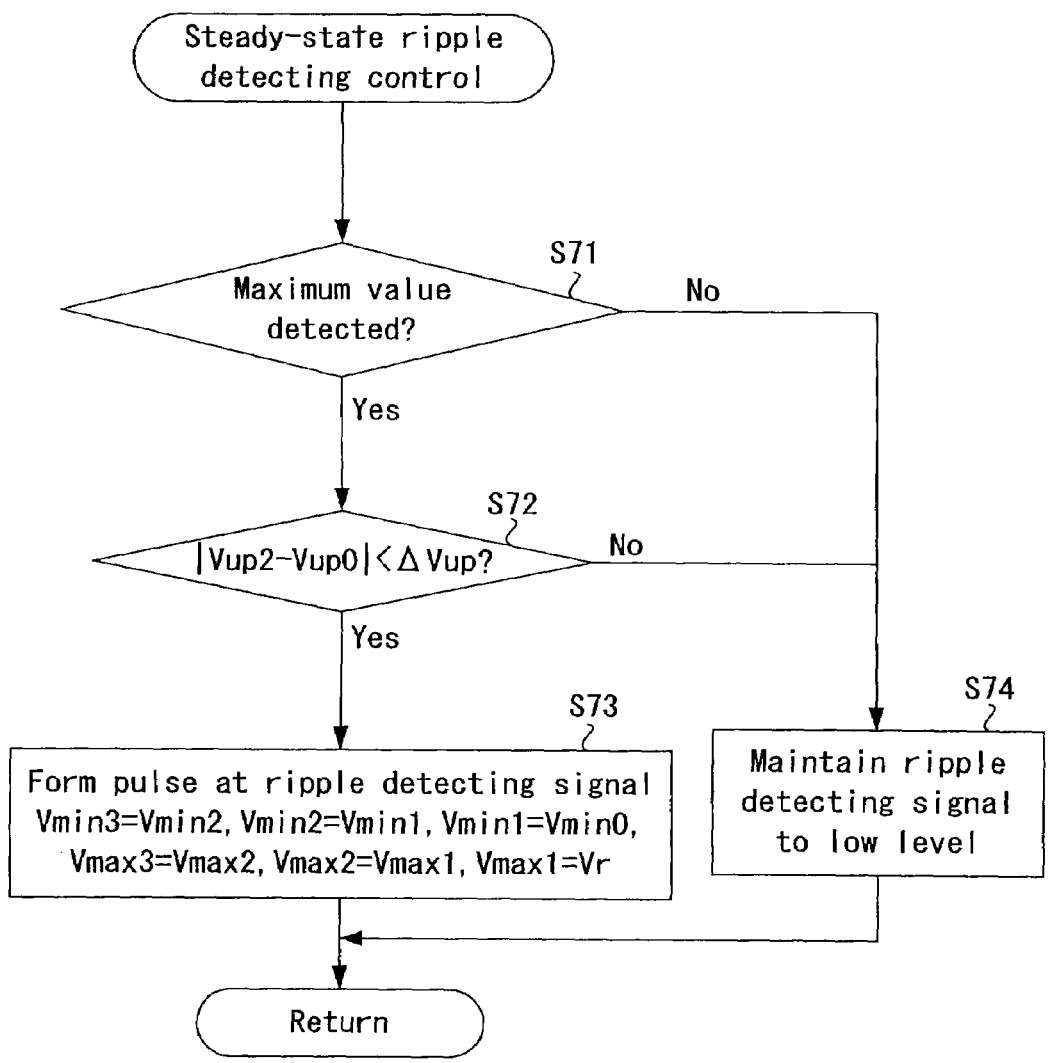
FIG. 14 is a flowchart similar to FIG. 9, but showing a fifth embodiment of the invention.
Figure 15:
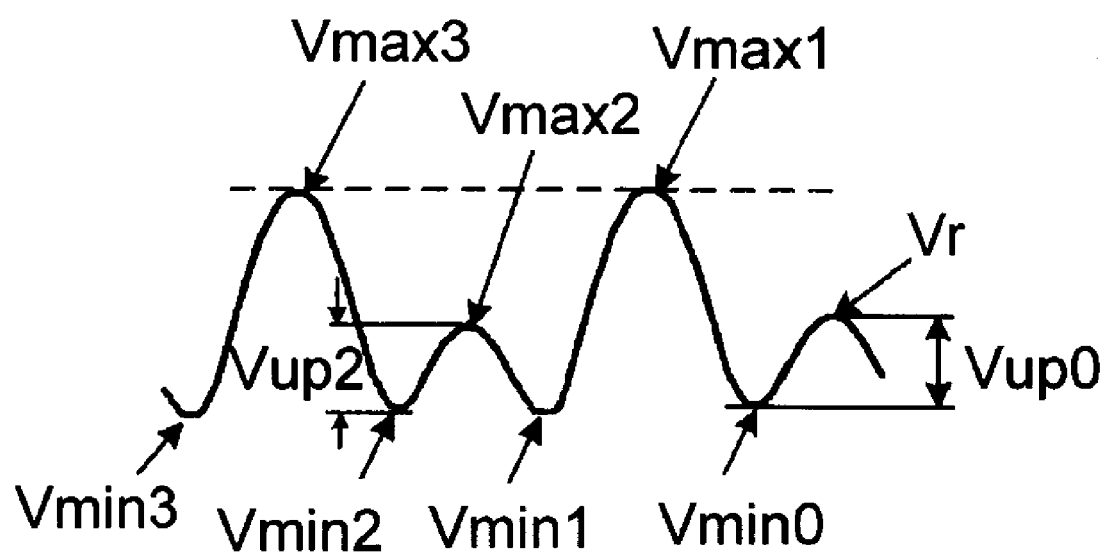
FIG. 15 illustrates a waveform of the armature current according to the fifth embodiment of the invention.

FIG. 14 shows the flowchart of the steady-state ripple detecting control according to the fifth embodiment of the invention. FIG. 15 shows a waveform of the armature current according to the fifth embodiment.

According to the embodiment, the maximum value of the armature current is detected and the ripple feature is the rising up amplitude from the minimum value of the armature current to the maximum value. The structure of the ripple detecting device is the same as that of the first embodiment. The armature current is overlapped with a low band noise of one half frequency of the ripple to be detected.

The initial ripple detecting control is achieved as the same method as the one in the first embodiment. After the initial ripple detecting control, a steady-state ripple detecting control is achieved by operating the DC motor under the load added state. The steady-state ripple detecting control in this embodiment includes the steps S71 to S74 in FIG. 14. When the peak detecting portion 51 detects the maximum value Vr (FIG. 15) in the armature current from the digital signal inputted from the A/D converter 40 (step S71: YES), the ripple detecting portion 52 obtains the amplitude Vup0 from the minimum value Vmin0 detected before the maximum value Vr (Vup0=Vr−Vmin0). Please refer to the waveform in FIG. 15. Then, the ripple detecting portion 52 obtains the rising up amplitude Vup2 which is the difference between the maximum value Vmax2 detected two ripples before and the minimum value Vmin2 which is detected before the maximum value Vmax2 (Vup2=Vmax2−Vmin2). Then the ripple detecting portion 52 judges whether or not the difference between the values of Vup2 and Vup0 is smaller than the predetermined value ΔVup (at the step S72). It is preferable to set the value ΔVup relative to the value Vup2.

When the amplitude difference between Vup2 and Vup0 is smaller than the value ΔVup (step S72: YES), it is assumed that a ripple is generated and the pulse is formed by changing the level of ripple detecting signal to high for a period of time (step S73). When the ripple detecting signal level is kept to high for a time period, the present maximum value Vr and past maximum values Vmax1 and Vmax2 are respectively shifted to the maximum values of Vmax1, Vmax2 and Vmax3 for preparing the coming of next ripple. Similarly, the minimum values of Vmin0, Vmin1 and Vmin2 are respectively shifted to Vmin1, Vmin2 and Vmin3.

When the maximum value Vr is not detected (step S71: NO), or the amplitude difference between Vup2 and Vup0 is not smaller than the predetermined value ΔVup (step S72: NO), the ripple signal level is kept to be Low (step S74).

By repeating the steps S71 to S74, a pulse is formed by synchronizing with the ripple overlapped with the armature current.

According to the fifth embodiment, a rising up amplitude is the ripple feature and a ripple can be surely detected even when the ripple or low band noise frequency is fluctuated.

Figure 16:
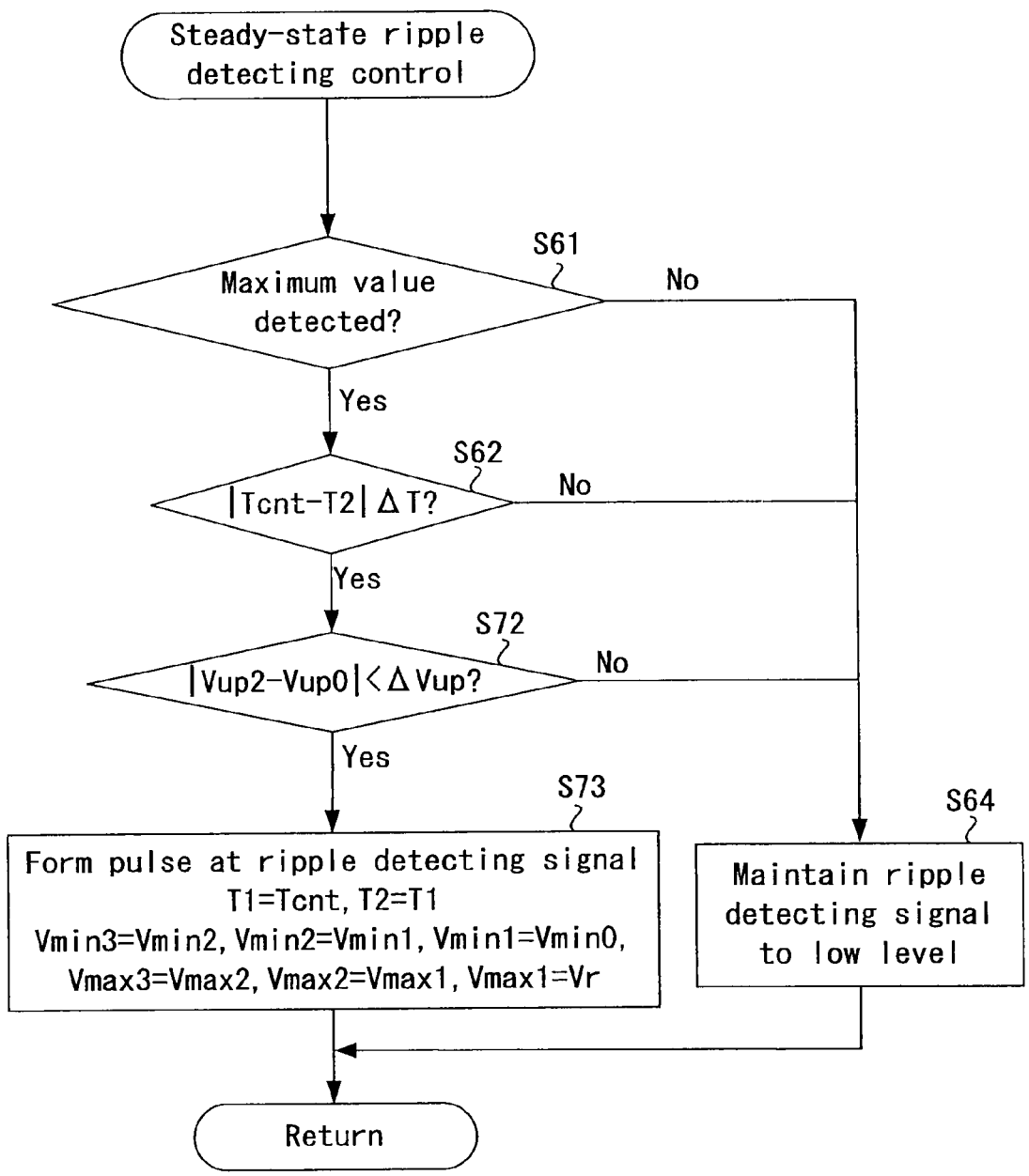
FIG. 16 is a flowchart similar to FIG. 9, but showing a sixth embodiment of the invention.

FIG. 16 shows the flowchart of the steady-state ripple detecting control according to the sixth embodiment of the invention. The same numerals are referenced with the same elements illustrated in FIG. 12 or FIG. 14.

According to this sixth embodiment, the ripple feature is assumed to be the time difference between the neighboring maximum values of the armature current as is the same with the fourth embodiment) and at the same time using a rising up amplitude as is the same with the fifth embodiment. The structure of the ripple detecting device is the same as that of the first embodiment. The armature current is overlapped with a low band noise of one half frequency of the ripple to be detected.

The initial ripple detecting control is achieved as the same method as the one in the first embodiment. After the initial ripple detecting control, a steady-state ripple detecting control is made by operating the DC motor under the load added state.

The peak detecting portion 51 of the detector 50 starts counting at the time when the maximum value Vmax1 of the armature current is detected from the digital signal (at the step S61: YES) and counts the cycle Tcnt until the next maximum value Vr is detected.

The ripple detecting portion 52 judges whether the difference between the cycle Tcnt counted at the peak detecting portion 51 and the ripple cycle T2 detected two ripples before is smaller than a predetermined value ΔT or not (at the step S62). It is preferable to set the value ΔT relatively to the value of cycle T2.

When the difference between the value Tcnt and the value T2 is detected to be smaller than the predetermined value ΔT by the ripple detecting portion 52, the ripple detecting portion 52 obtains the amplitude Vup0 from the minimum value Vmin0 detected before the maximum value Vr (Vup0=Vr−Vmin0, see FIG. 15). Then, the ripple detecting portion 52 obtains the rising up amplitude Vup2 which is the difference between the maximum value Vmax2 detected two ripples before and the minimum value Vmin2 which is detected before the maximum value Vmax2 (Vup2=Vmax2−Vmin2). Then the ripple-detecting portion 52 judges whether or not the difference between the values of Vup2 and Vup0 is smaller than the predetermined value ΔVup (at the step S72). It is preferable to set the value ΔVup relative to the value Vup2.

When the amplitude difference between Vup2 and Vup0 is smaller than the value ΔVup (step S72: YES), it is assumed that a ripple is generated and the pulse is formed by changing the level of ripple detecting signal to high for a period of time (step S73). When the ripple detecting signal level is kept to high level for a time period, the present maximum value Vr and past maximum values Vmax1 and Vmax2 are respectively shifted the maximum values of Vmax1, Vmax2 and Vmax3 for preparing the detection of next ripple. Similarly, the minimum values of Vmin0, Vmin1 and Vmin2 are respectively shifted to Vmin1, Vmin2 and Vmin3. Further, the cycle Tcnt is shifted to the ripple cycle T1 which corresponds to the cycle one before. The previous cycle T1 then is shifted to the cycle T2 which corresponds to the cycle two ripples before.

When the maximum value Vr is not detected (step S61: NO), or when the difference between the values Tcnt and T2 is not smaller than the predetermined value ΔT (step S62), or when the amplitude difference between Vup2 and Vup0 is not smaller than the predetermined value ΔVup (step S72: NO), the ripple signal level is kept to be Low (step S64).

According to the sixth embodiment, since the time difference between the maximum values and the rising up amplitude are the ripple features, a ripple can be surely detected, as is the same in the third embodiment.

According to the previous embodiments, the overlapping low band noise frequency is one half of the ripple to be detected, but can be one third or one fourth of the ripple to be detected. When the low band noise is one/N of the ripple to be detected, the feature of the ripple to be compared with the ripple at present point will be the ripple feature N1 times past. Thus, the waveform at present may approximately correspond to the waveform of the past and the detection can be accurately made because of the resemblance of the waveform at the present and the past.

Some other ripple features can be considered such as the ratio of rising up amplitude and the rising down amplitude or the time band between the maximum value and the minimum value.

In this invention, the ripple detecting device can be used for method for detecting a ripple using this ripple detecting device. According to one example of such method, a method for detecting a ripple in an armature current outputted from a motor, the current including a ripple frequency to be detected and a low band noise frequency of 1/n (wherein n is a natural number more than 1) of the ripple frequency overlapped on the ripple frequency, comprising the processes of:

an initial ripple detecting process for detecting the ripple cycle in advance;

a process for detecting a feature of the ripple from the armature current outputted from the motor; and a ripple detecting process for detecting that a ripple is generated or not by comparing a ripple feature of the armature current at a certain past time point determined by the low band noise frequency which is earlier than the present time point with a ripple feature of the armature current at the present time point and judging that a ripple is generated when the two ripple features are resembled.

The principles, preferred embodiment and mode of operation of the present invention have been described in the foregoing specification. However, the invention, which is intended to be protected, is not to be construed as limited to the particular embodiments disclosed. Further, the embodiments described herein are to be regarded as illustrative rather than restrictive. Variations and changes may be made by others, and equivalents employed, without departing from the sprit of the present invention. Accordingly, it is expressly intended that all such variations, changes and equivalents that fall within the spirit and scope of the present invention as defined in the claims, be embraced thereby.

What is claimed is:

1. A ripple detecting device for detecting a ripple from an armature current outputted from a motor by overlapping a low band noise having a frequency of one/n (1/n) of the armature current (wherein "n" is a natural number more than 1), comprising:

a feature detecting means for detecting a feature of the ripple from the armature current outputted from the motor; and a ripple detecting means for detecting a ripple while the motor is in a loaded state by comparing a feature of the ripple with the low band noise, occurring during the loaded state, having a frequency of one/n detected by the feature detecting means, at a time point prior to a present time point by a predetermined number of cycles greater than one, with a feature of the ripple in the loaded state detected by the feature detecting means at the present time point, and judging that a ripple is generated when the feature of the time point prior to the present time point and the feature of the present time point satisfy a predetermined relation.

2. The ripple detecting device according to claim 1, wherein the low band noise includes only one noise frequency and wherein the time point before the present time point is a time point corresponding to the "n" ripple cycles before the present time point.

3. The ripple detecting device according to claim 1 wherein the feature of the ripple detected by the feature detecting means is a time difference between the maximum points of the armature current or between the minimum points of the armature current.

4. The ripple detecting device according to claim 1 wherein the feature of the ripple detected by the feature detecting means is a value difference between the maximum values or between the minimum values.

5. The ripple detecting device according to claim 4, wherein the maximum and minimum values represent electric current.

6. The ripple detecting device according to claim 4, wherein the maximum and minimum values represent electric current.

7. The ripple detecting device according to claim 1, wherein the predetermined relation is that an absolute value of a difference between the two features is less than a predetermined value.

8. The ripple detecting device according to claim 1 wherein the feature of the ripple detected by the feature detecting unit is a time difference between the maximum points of the armature current or between the minimum points of the armature current.

9. The ripple detecting device according to claim 1 wherein the feature of the ripple detected by the feature detecting unit is a value difference between the maximum values or between the minimum values.

10. A ripple detecting device for detecting a ripple from an armature current outputted from a motor by overlapping a low band noise having a frequency of one/n (1/n) of the armature current (wherein "n" is a natural number more than 1), comprising:

an initial ripple detecting means for detecting a cycle of the ripple;

a feature detecting means for detecting a feature of the ripple from the armature current outputted from the motor; and a ripple detecting means for detecting a ripple by comparing a feature of the ripple with the low band noise having a frequency of one/n detected by the feature detecting means, at a time point prior to a present time point, with a feature of the ripple detected by the feature detecting means at the present time point, and judging that a ripple is generated when the feature of the time point before the present time point and the feature of the present time point satisfy a predetermined relationship, wherein the low band noise includes a plurality of noises having different frequencies from one another and the time point before the present time point is a time point a predetermined time period prior to the present time point and the predetermined time period is a time corresponding to a value obtained by multiplying the ripple cycle by a ratio of each low band noise frequency cycle relative to the ripple cycle.

11. A ripple detecting device for detecting a ripple from an armature current outputted from a motor by overlapping a low band noise having a frequency of one/n (1/n) of the armature current (wherein "n" is a natural number more than 1), comprising:

a feature detecting unit that detects a feature of the ripple from the armature current outputted from the motor; and a ripple detecting unit that detects a ripple in a loaded state by comparing a feature of the ripple with the low band noise, occurring during a loaded state, having a frequency of one/n detected by the feature detecting unit, at a time point prior to a present time point by a predetermined number of cycles greater than one, with a feature of the ripple in the loaded state detected by the feature detecting means at the present time point, and judging that a ripple is generated when the feature of the time point before the present time point and the feature of the present time point satisfy a predetermined relation.

* * * * *